United States Patent [19]

Wood et al.

[11] 4,436,557

[45] Mar. 13, 1984

[54] MODIFIED LASER-ANNEALING PROCESS FOR IMPROVING THE QUALITY OF ELECTRICAL P-N JUNCTIONS AND DEVICES

[75] Inventors: Richard F. Wood, Oak Ridge; Rosa T. Young, Farragut, both of Tenn.

[73] Assignee: The United States of America as represented by the United States Department of Energy, Washington, D.C.

[21] Appl. No.: 349,959

[22] Filed: Feb. 19, 1982

[51] Int. Cl.³ .................... H01L 21/263; H01L 21/24
[52] U.S. Cl. ...................................... 148/1.5; 29/572; 29/576 B; 136/258; 136/261; 148/187; 357/91
[58] Field of Search ............... 148/1.5, 187; 29/576 B, 29/572; 357/91; 427/53.1; 136/258 PC, 261

[56] References Cited

U.S. PATENT DOCUMENTS

| | | | |
|---|---|---|---|
| 3,533,857 | 10/1970 | Mayer et al. | 148/1.5 |
| 4,309,225 | 1/1982 | Fan et al. | 148/1.5 |
| 4,331,485 | 5/1982 | Gat | 148/1.5 |
| 4,359,486 | 11/1982 | Patalong et al. | 427/53.1 |

OTHER PUBLICATIONS

Young et al., Appl. Phys. Letts, 39 (Aug. 1981) 313.
Young et al., ed W. Palz in Third E.C. Photovoltaic Solar Energy Conf., Reidel, London, 1981, p. 703.
Nakamura, J. Appl. Phys. 52 (Feb. 1981) 1100.
Cohen et al., Appl. Phys. Letts., 33 (1978) 751.
Wilson et al., J. Vac. Sci. Technol. 20 (Jan. 1982) 92.
Lever, R. F. IBM-TDB, 21 (1979) 4040.
Wood et al., SPIE, vol. 198, (1979) 2.
Poate et al., Radiation Effects, 48 (1980) 167.

Primary Examiner—Upendra Roy
Attorney, Agent, or Firm—Fred O. Lewis; Stephen D. Hamel

[57] ABSTRACT

The invention is a process for producing improved electrical-junction devices. The invention is applicable, for example, to a process in which a light-sensitive electrical-junction device is produced by (1) providing a body of crystalline semiconductor material having a doped surface layer, (2) irradiating the layer with at least one laser pulse to effect melting of the layer, (3) permitting recrystallization of the melted layer, and (4) providing the resulting body with electrical contacts. In accordance with the invention, the fill-factor and open-circuit-voltage parameters of the device are increased by conducting the irradiation with the substrate as a whole at a selected elevated temperature, the temperature being selected to effect a reduction in the rate of the recrystallization but insufficient to effect substantial migration of impurities within the body. In the case of doped silicon substrates, the substrate may be heated to a temperature in the range of from about 200° C. to 500° C.

11 Claims, 4 Drawing Figures

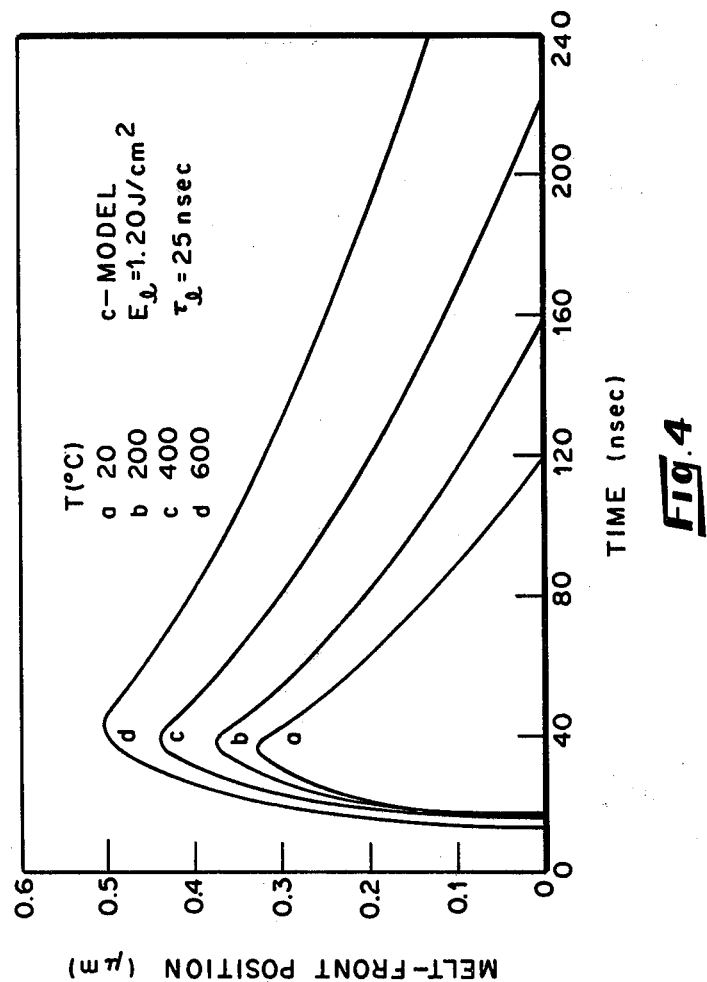

MODIFIED LASER-ANNEALING PROCESS FOR IMPROVING THE QUALITY OF ELECTRICAL P-N JUNCTIONS AND DEVICES

The invention is a result of a contract with the U.S. Department of Energy.

BACKGROUND OF THE INVENTION

This invention relates generally to processes for improving selected characteristics of electrical junctions and devices incorporating the same. More particularly, it relates to improvements in processes which utilize pulsed-laser melting in the production of electrical-junction devices.

An effective technique for the production of p-n electrical junctions in semiconductor substrates comprises doping a surface layer of the substrate by ion-implantation or thermal diffusion and then annealing the doped layer with one or more laser pulses. That technique is described in detail in U.S. Pat. No. 4,181,538, issued to J. Narayan, C. W. White, and R. T. Young, on Jan. 1, 1980. Another effective technique for producing electrical junctions comprises depositing a film of dopant on a surface of a semiconductor substrate and melting the surface by means of one or more laser pulses to effect diffusion of the dopant and annealing. That technique is disclosed in U.S. Pat. No. 4,147,563, issued to R. T. Young and J. Narayan on Apr. 3, 1979. Both of the processes referred to above provide significant advantages in the production of high-efficiency solar cells and other devices. For example, they can be conducted in air and they permit the following: localization of applied heat to a thin surface layer, precise control of the emitter dopant concentration over a wide range for a fixed junction depth (with ion implanation), and nearly complete electrical activation of dopants at concentrations well above the solid-solubility limit in nearly perfect emitter regions. Unfortunately, the resulting recrystallized layer contains electrically active point defects which limit the quality of the electrical junction.

The prior art includes the process of laser-annealing a doped crystalline silicon surface by raster-scanning it with a continuous-wave (CW) laser beam. Because high-energy annealing would damage the surface, the entire substrate is heated to a moderate temperature (e.g., 350° C.) throughout the CW-laser scanning operation, which may take as long as half an hour; that is, heating of the substrate permits CW-laser annealing to be accomplished with minimal surface damage due to thermal shock. However, post-annealing at, say, 700° C. for more than one hour is necessary in order to remove residual defects in the near-surface region. The use of substrate heating to achieve a reduction in laser energy density for pulsed-laser annealing is disclosed in SPIE Vol. 198 (1980), Society of Photo Optical Instrumentation Engineers.

SUMMARY OF THE INVENTION

It is an object of this invention to provide a new process for the production of p-n junctions in semiconductor substrates.

It is another object to provide an improved pulsed-laser melting process for the production of electrical junctions.

It is another object to provide a process for the production of improved p-n junction devices, the devices being characterized by an improvement (decrease) in reverse saturation current.

It is another object to provide a new process for the production of light-responsive junction devices, the devices being characterized by improvements (increases) in open-circuit voltage and fill factor.

In one aspect, the invention may be summarized as follows: in a process for producing a light-responsive electrical-junction device, said process including the steps of providing a body of crystalline semiconductor material having a doped surface layer, irradiating said layer with a least one laser pulse to effect melting of the same, permitting recrystallization of the material so melted, and providing the resulting body with electrical contacts, the improvement comprising: increasing the open-circuit-voltage parameter for said device by heating said body to a selected temperature and conducting said irradiating operation while said body is so heated, said temperature being sufficient to effect a reduction in the rate of said recrystallization but insufficient to effect substantial migration of impurities within said body. In one form of the process, the irradiating operation is conducted with the substrate at a temperature in the range from about 100° C. to 550° C. In another aspect, the invention is summarized as follows: a process for producing an electrical-junction device, said process including the steps of providing a body of crystalline semiconductor material having a doped surface layer, irradiating said layer with at least one laser pulse to effect melting of the same, permitting recrystallization of the material so melted, and providing the resulting body with electrical contacts, the improvement comprising: decreasing the reverse-saturation-current parameter for said device by heating said body to a selected temperature and conducting said irradiating operation while said body is so heated, said temperature being sufficient to effect a reduction in the rate of said recrystallization but insufficient to effect substantial migration of impurities within said body.

DETAILED DESCRIPTION OF THE INVENTION

Figure 1:
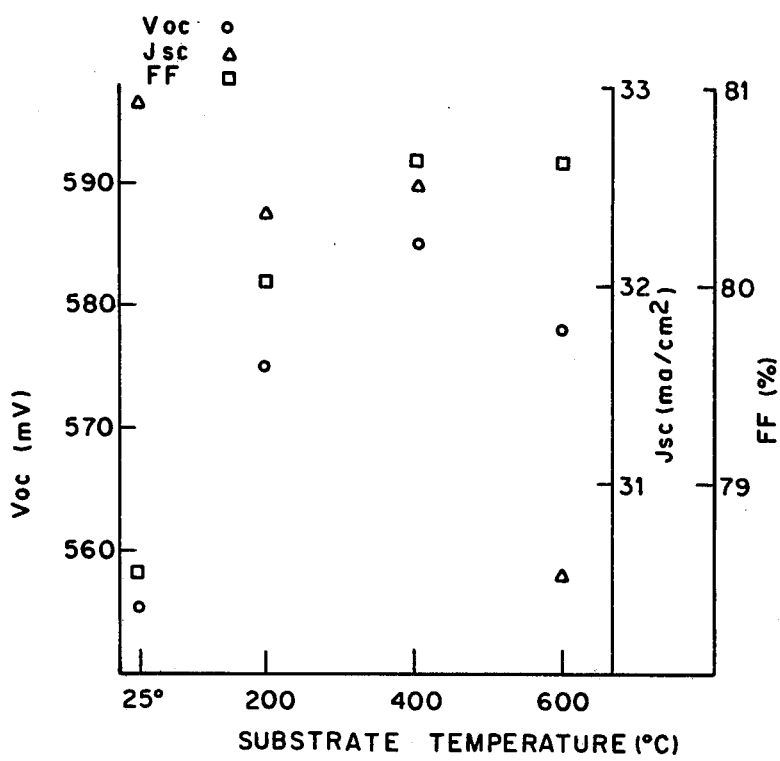
FIG. 1 is a graph correlating open-circuit voltage ($V_{oc}$), short-circuit current ($J_{sc}$), and FF (fill factor) with substrate tepmerature for silicon solar cells processed in accordance with the invention.

This invention was made in the course of experiments conducted with ion-implanted silicon substrates. The ion-implanted layers were to be annealed with laser pulses, and the experiments were directed toward finding if heating of the substrate would make the use of lower-energy pulses feasible. Unexpectedly, devices utilizing the resulting junction exhibited significant improvements in quality. The invention is not limited to silicon substrates or to any one type of junction device, but for brevity it will be illustrated in terms of the production of silicon solar cells and diodes.

EXAMPLE I

Improved P+N Solar Cells

Conventional techniques were used to prepare wafers measuring about 1×2 cm from (100)-oriented, 5 Ω-cm, n-type Czochralski silicon. The wafers, or substrates, were implanted with boron at an energy of 5 keV in a dose range from $2 \times 10^{14}$ to $10^{15}$ cm$^{-2}$. Laser annealing of the resulting amorphous implanted regions was conducted in air, with a conventional Q-switched ruby laser operating under multimode conditions, each pulse having a duration of 20 nsec and an energy density of 0.8–1.2 J/cm$^2$. Either one or two pulses were applied, depending on the area to be melted. A diffuser plate made of ground quartz was used to improve the spatial uniformity of the laser beam.

In accordance with the invention, the laser annealing was conducted with the wafer positioned on an electrically heated plate which was maintained at a selected temperature (discussed below), throughout irradiation. The wafer was maintained flat against the plate by vacuum—i.e., a vacuum pump was connected to a pinhole traversing the plate. The temperature of the wafer was monitored with a thermocouple connected to the plate at a point close to the wafer. The wafer was removed from the heater promptly after recrystallization to avoid possible degradation due to the introduction of impurities from the heater, the chamber, or the the surface of the wafer. (This is in contrast to customary CW-laser annealing, where heating of the wafer at 350° C. or higher may be continued for as long as a half-hour after completion of the entire raster-scanning operation in order to achieve complete annealing.) Because of the time required for positioning, firing, and removal, the wafer during pulsed-laser annealing may be in contact with the heater for one to or two minutes. (Laser-induced melting and the subsequent recrystallization require only microseconds.)

The irradiated wafers were provided with front contacts formed by evaporation of Ti-Pd-Ag layers (sintered at 500° C. for 2 min) and with back contacts formed by deposition of 5 μm of Al (with no subsequent sintering). A 650-Å layer of Ta$_2$O$_5$ was evaporated on the front surface to serve as an antireflection coating. No backsurface fields (BSF) were formed in these solar cells.

The open-circuit voltage (V$_{oc}$) of the solar cells then was measured, in accordance with the following rationale: in the ideal case, the V$_{oc}$ of a solar cell under illumination is given by $$V_{oc} = \frac{kT}{q} \ln \frac{J_{sc}}{J_{eo} + J_{bo}},$$

where J$_{sc}$ is the short circuit current density, and J$_{eo}$ and J$_{bo}$ are the saturation current densities for the emitter and base regions, respectively. In cells with very nearly equal values of J$_{bo}$, differences in V$_{oc}$ are primarily related to J$_{eo}$, which is governed by surface and bulk recombination in the emitter region. The above-described solar cells were fabricated of the same starting material and subjected to the same kinds of annealing. They should have nearly the same value of J$_{bo}$ and surface recombination velocity because the base region is virtually undisturbed by the laser irradiation, and the same surface treatments can be applied to all the cells. Therefore, the emitter recombination or the quality of the laser regrown layer can be monitored by measurements of V$_{oc}$.

FIG. 1 presents the V$_{oc}$ values obtained for a group of the above-mentioned solar cells. These cells had been implanted with boron at 5 keV, $6 \times 10^{15}$ cm$^{-2}$ and then were laser-annealed as described, with the substrate temperature (T$_s$) maintained at one of the following values: 25° C., 200° C., 400° C., and 600° C. Each of the data points is an average of 4 cells. The data clearly indicate that V$_{oc}$ increases substantially as T$_s$ is increased from 25° C. to 400° C., and then remains constant or drops slightly at 600° C. The value of 585 mV for V$_{oc}$ (measured at 21° C.) obtained for T$_s$=400° C. is the highest ever reported for cells made from 5 Ω-cm base material without a BSF. FIG. 1 shows the importance of T$_s$ for improving V$_{oc}$, the improvement evidently being due to the suppression of J$_{eo}$. The J$_{sc}$ and FF values for the cells also are shown in FIG. 1. The J$_{sc}$ remains nearly constant up to 400° C., and then sharply decreases at 600° C. This decrease is most likely caused by the degradation of the minority carrier diffusion length (MCDL) as a result of contamination from the sample chamber at 600° C., even though the cells were held at 600° C. for less than two minutes; such contamination was suggested by a noticeable decrease in the spectral response in the long wavelength region. All of the cells represented in FIG. 1 have values of FF>78%, which indicates that nearly perfect junctions and good ohmic contacts were obtained. It will be understood that this mode of improving FF is not limited to solar cells but is generally applicable to any laser-processsd p-n junction.

Figure 2:
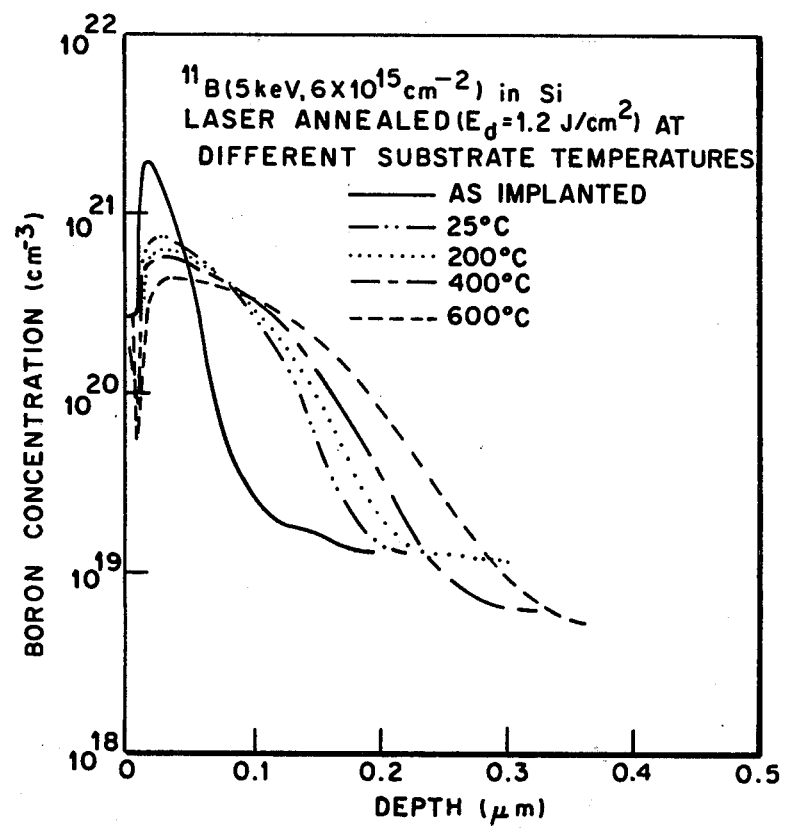
FIG. 2 is a correlation of substrate temperature and dopant profiles for boron-implanted silicon wafers processed in accordance with the invention.

To gain insight into the physical significance of heating the substrate as a whole during pulsed laser annealing, dopant profiles were measured by SIMS (secondary ion mass spectroscopy), with the results shown in FIG. 2. The profiles are typical of pulsed-laser-annealed Si. As expected, with El (energy-density level) held constant, the dopant spread farther into the substrate when T$_s$ was increased (see Table, below). Thus, substrate heating may be used to achieve a given depth of dopant penetration at lower laser energy levels, where the laser is more stable and has longer operating life. The SIMS profiles fit well with calculations of thermal and mass transport during pulsed laser annealing. The following table is based on these calculations and presents information on the variation of melt depth and recrystallization velocity with T$_s$.

| Calculated Melt Depth and Regrowth Velocity as a Function of Substrate Temperatures | | | | |
|---|---|---|---|---|
| T$_s$ | 20° C. | 200° C. | 400° C. | 600° C. |
| Melt depth (μm) | 0.328 | 0.377 | 0.438 | 0.506 |
| Regrowth velocity (m/sec) | 3.2 | 2.7 | 2.1 | 1.7 |

Since the damaged layer from low-energy implanation of boron does not exceed 1500 Å, the melting depth of ~3000 Å achieved with T$_s$=20° C. and El=1.2 J/cm$^2$ would be expected to give a good epitaxially regrown layer. Still referring to the table, the fact that V$_{oc}$ reached a maximum at 400° C. suggests that the quality of the regrown layer is dependent on the recrystallization velocity.

Although we do not wish to be bound by any theory regarding the mechanism by which our invention effects improvements, we are of the opinion that the concentration of quenched-in point defects is reduced because heating of the substrate decreases the recrystallization velocity, thus providing a smaller $J_{eo}$ and a higher $V_{oc}$. This hypothesis is supported by FIG. 4, which presents calculated values of the melt-front position as a function of time after firing the laser. The data in the foregoing table were extracted from the detailed numerical heat-transport calculations, leading to FIG. 4.

In our opinion, our process is effective because it produces a regrown layer which is characterized by relatively few residual lattice defects. That is, the regrown layer more closely approaches the perfect lattic structure, where every lattice site is filled with a dopant atom or silicon atom and where no dopant or silicon atoms occupy interstitial sites.

EXAMPLE II

Improved P+N Diodes

Diodes were prepared in accordance with the invention as described above. That is, wafers were prepared from (100)-oriented, 5 Ω-cm Czochralski silicon and then were implanted with boron at an energy of 5 keV to a dose of $6 \times 10^{15}$ cm$^{-2}$. The implanted wafers were heated to a selected temperature (25° C. or 400° C.) as described and while at that temperature were laser annealed in air with one pulse of a Q-switched ruby laser operated under multimode conditions. The pulse duration was 20 nsec and the energy density level was 1.2 J/cm$^2$. The resulting wafer was provided with suitable contacts by standard metallization techniques.

Figure 3:
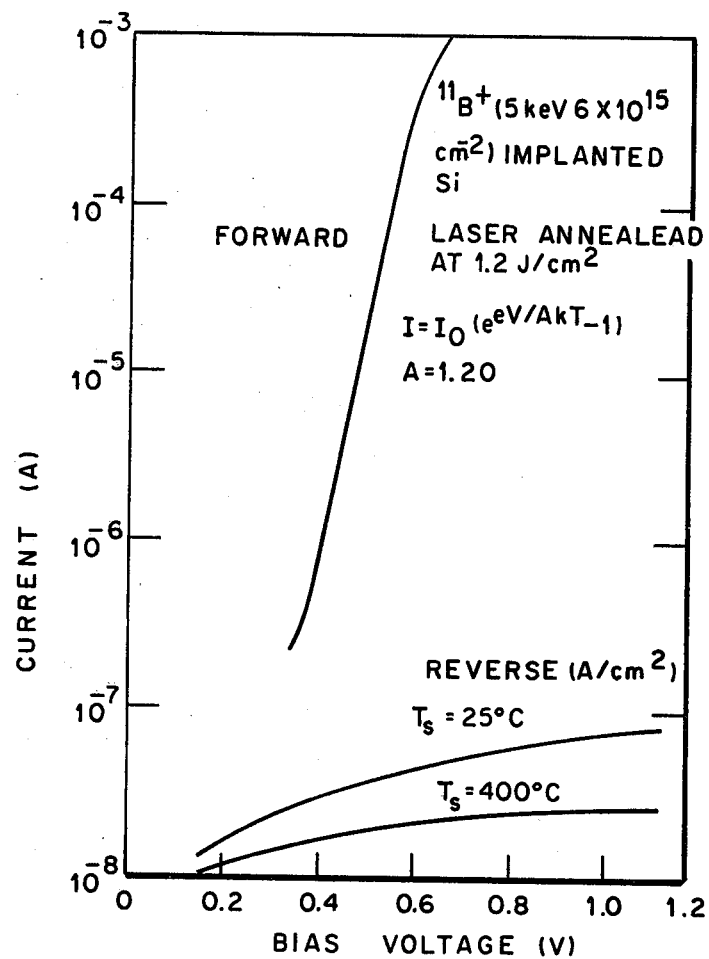
FIG. 3 is a graph presenting the forward current and reverse-saturation parameters for boron-implanted silicon wafers processed in accordance with the invention, the reverse-saturation-current parameters relating to wafers which were maintained at bulk temperatures of 25° C. and 400° C., respectively, throughout laser treatment, and FIG. 4 relates to the above-mentioned boron-implanted silicon wafers and is a correlation of the position of the boundary between the melted and solid material with the time after the laser pulse.

FIG. 3 presents the forward current and reverse-saturation-current characteristics for a typical one of the above-described diodes. As shown in FIG. 3, the diode perfection factor A was found to be 1.20, an excellent value for silicon. The graph compares the reverse-saturation-current curves obtained for substrates which were laser-annealed at 25° C. and at 400° C., respectively. As shown, annealing with the substrate at the higher temperature produced a significant improvement in reverse-saturation-current. It will be apparent that our process for improving this parameter is applicable to p-n junction devices in general.

Our process is applicable to, but not limited to, laser-melting operations of the kind described in the above-referenced patents—i.e., to the laser annealing of ion-implanted or thermally doped layers and to the diffusion of deposited dopant layers into a substrate by laser melting. The substrate may be monocrystalline or polycrystalline. We believe the process is generally applicable to crystalline semiconductor materials, whether in the elemental state (e.g., germanium) or in the form of compounds (e.g., gallium arsenide). The laser-melting operation may be conducted with any suitable pulsed laser—as, for example, ruby Nd:YAG; Nd:glass; excimer; and CO$_2$ lasers. Referring to the substrate-heating operation, we have found that the substrate should be maintained at a temperature which is sufficient to decrease the rate of recrystallization of the laser-melted layer but which is insufficient of itself to effect appreciable migration of impurities (contaminants or the dopant) within the substrate. Our data suggest that in the case of silicon or germanium solar cells or diodes, an improvement in performance is obtained by conducting the laser-melting operation while the substrate is maintained at a temperature in the range of about 100° C. to 575° C. However, we prefer a temperature in the range of 400° C. to 500° C. The substrate may be heated by any such technique—as, for example, radiant heating or heating of the kind described. One who is versed in the art and is made aware of the teachings herein can, by merely routine experimentation, determine the most suitable conditions for practicing the invention with a given substrate-dopant system.

What is claimed is:

1. In a process for producing a light-responsive electrical-junction device, said process including the steps of providing a body of crystalline semiconductor material having a doped surface layer, irradiating said layer with at least one laser pulse to effect melting of the same, permitting recrystallization of the material so melted, and providing the resulting body with electrical contacts, the method of increasing the open-circuit-voltage parameter for said device, comprising:
   heating said body to a selected temperature and conducting said irradiating operation while said body is so heated to effect an increase in said parameter, said temperature being sufficient to effect a reduction in the rate of said recrystallization but insufficient to effect substantial migration of impurities within said body.

2. The process of claim 1 wherein said material is one of silicon and germanium.

3. The process of claim 1 wherein said temperature is in the range from about 100° C. to about 500° C.

4. The process of claim 1 wherein said laser pulse is generated by a Q-switched laser.

5. The process of claim 3 wherein said temperature is in the range from about 400° C. to 500° C.

6. In a process for producing an electrical-junction device, said process including the steps of providing a body of crystalline semiconductor material having a doped surface layer, irradiating said layer with at least one laser pulse to effect melting of the same, permitting recrystallization of the material so melted, and providing the resulting body with electrical contacts, the method of decreasing the reverse-saturation-current parameter for said device, comprising:
   heating said body to a temperature in the range from about 100° C. to 500° C. and conducting said irradiating operation with one of a Q-switched ruby laser and Nd:YAG laser while said body is so heated to effect a decrease in said parameter.

7. The process of claim 6 wherein said material is one of silicon and germanium.

8. In a process for producing an electrical-junction device, said process including the steps of providing a body of crystalline semiconductor material having a film of dopant deposited on a surface layer thereof, irradiating said film and layer with at least one laser pulse to effect melting of the same, permitting recrystallization of the material so melted, and providing the resulting body with electrical contacts, the method of increasing the fill-factor parameter for said device, comprising:
   conducting said irradiating operation a Q-switched laser while said body is heated to a temperature effecting an increased in said parameter, said temperature being sufficient to effect a reduction in the rate of recrystallization but not sufficient to effect substantial migration of impurities within said body.

9. The process of claim 8 wherein said temperature is in the range from about 100° C. to 550° C.

10. The process of claim 9 wherein said temperature is in the range from about 400° C. to about 500° C.

11. In a process for producing a light-responsive electrical-junction device, said process including the steps of providing a body of crystalline semiconductor material selected from the group consisting of silicon and germanium and having a doped surface layer, irradiating said layer with at least one laser pulse to effect melting of the same, permitting recrystallization of the material so melted, and providing the resulting body with electrical contacts, the method of increasing the fill-factor parameter for said device, comprising:

heating said body to a selected temperature and conducting said irradiating operation while said body is so heated to increase said parameter, said temperature being sufficient to effect a reduction in the rate of said recrystallization but insufficient to effect substantial migration of impurities within said body.

* * * * *